(12) United States Patent
Oshinowo

(10) Patent No.: US 6,607,604 B1
(45) Date of Patent: Aug. 19, 2003

(54) METHOD AND APPARATUS FOR TREATING SUBSTRATES

(75) Inventor: John Oshinowo, Schlaitdorf (DE)

(73) Assignee: Steag MicroTech GmbH (DE)

( * ) Notice: Subject to any disclaimer, the term of this patent is extended or adjusted under 35 U.S.C. 154(b) by 0 days.

(21) Appl. No.: 09/600,084

(22) PCT Filed: Nov. 18, 1998

(86) PCT No.: PCT/EP98/07405

§ 371 (c)(1), (2), (4) Date: Jun. 30, 2000

(87) PCT Pub. No.: WO99/35672

PCT Pub. Date: Jul. 15, 1999

(30) Foreign Application Priority Data

Dec. 31, 1997 (DE) .......................... 197 58 267

(51) Int. Cl.⁷ ................................. B08B 3/12
(52) U.S. Cl. ............................ 134/1; 134/1.3; 134/184; 134/902
(58) Field of Search ............................ 134/1, 1.3, 184, 134/902

(56) References Cited

U.S. PATENT DOCUMENTS

| | | | | |
|---|---|---|---|---|
| 4,909,266 A | * | 3/1990 | Massa .......................... | 134/60 |
| 5,133,376 A | * | 7/1992 | Samarin et al. ............. | 134/184 |
| 5,379,785 A | * | 1/1995 | Ohmori et al. .............. | 134/184 |
| 5,383,484 A | * | 1/1995 | Thomas et al. ............. | 134/184 |
| 5,617,887 A | * | 4/1997 | Shibano ....................... | 134/184 |
| 5,752,302 A | * | 5/1998 | Sheen et al. .................. | 28/181 |
| 6,098,643 A | * | 8/2000 | Miranda ..................... | 134/186 |
| 6,240,938 B1 | * | 6/2001 | Oshinowo .................... | 134/147 |

FOREIGN PATENT DOCUMENTS

| | | |
|---|---|---|
| DE | 197 22 423 | 12/1997 |
| JP | 04247276 | 9/1992 |
| WO | WO 95/02473 | 1/1995 |

OTHER PUBLICATIONS

JP 09199454, Patent Abstracts of Japan published Jul. 31, 1997.

* cited by examiner

Primary Examiner—Zeinab El-Arini
(74) Attorney, Agent, or Firm—R W Becker & Associates; R W Becker

(57) ABSTRACT

A method and apparatus for treating substrates in a fluid container with at least one fluid and ultrasound provided. Each of two oppositely disposed walls of the fluid container are provided with at least two ultrasound radiation areas that can be respectively individually activated. The ultrasound radiation areas of one of the container walls is activated in a chronological relationship to the ultrasound radiation areas of the other container wall in such a way that oppositely disposed ultrasound radiation areas of the container walls are not activated simultaneously.

14 Claims, 2 Drawing Sheets

METHOD AND APPARATUS FOR TREATING SUBSTRATES

This is a national stage application of PCT/EP98/07405 filed Nov. 18, 1988.

BACKGROUND OF THE INVENTION

The present invention relates to a method and an apparatus for treating substrates in a fluid container with at least one fluid and with ultrasound, whereby oppositely disposed walls of the container are respectively provided with at least two ultrasound radiation areas that are or can be respectively individually activated.

Apparatus of this type are known, for example, from WO 95/02473, or from DE 197 22 423 belonging to the assignee of the present application. With these apparatus, the substrates are disposed in the fluid container during the treatment, and treatment fluids are introduced into the fluid container via an inlet opening.

At the same time, or subsequent to the fluid treatment, the substrates are irradiated with ultrasound in order to improve and accelerate the cleaning process. In this connection, it is important that the substrates be uniformly irradiated in order to generate a uniform cleaning effect. This uniform irradiation of the substrates is, however, not possible with the known apparatus because irradiation cones generate different irradiation intensities, or even dead angles occur. With the apparatus known from WO 95/02473, ultrasound radiation devices are provided on opposite side walls. The ultrasound radiation devices are formed by horizontally extending ultrasound strips. In order to achieve a uniform irradiation of the substrates, guide devices for the substrates are disposed on the inner surfaces of the side walls of the fluid container and the ultrasound radiation areas are offset. By doing so, only a limited improvement with regard to a uniform irradiation of the substrates is possible because these guide devices, which are arranged across from the ultrasound radiation areas, due to the thereby occurring dampening cause other irradiation intensities than is the case beyond the regions in which the guide devices are not present. Furthermore, this arrangement has the problem that upon irradiation of the substrates from the oppositely disposed side walls, reciprocal effects and wave quenching occur, especially with ultrasound waves that run into one another, as a result of which at best only a limited uniform irradiation of the substrates, and hence a uniform cleaning effect, are possible.

U.S. Pat. No. 4,909,266 discloses an apparatus for treating substrates with ultrasound where the ultrasound waves are selectively and briefly radiated in order to thereby increase a cleaning effect. This apparatus does not prevent any previously described reciprocal effects and wave quenching, which prevent a uniform cleaning effect.

JP 9-199 464 A (abstract) discloses an apparatus having groups of ultrasound radiation regions with different frequencies in order to remove particles having different sizes from a substrate that is to be cleaned. This apparatus also has the drawback that no uniform cleaning effect results because here again the ultrasound waves are in interaction or quenching.

The object of the invention is to provide a method and an apparatus for treating substrates that enable a more uniform and intensive treatment of the substrate surfaces with ultrasound.

This stated object is inventively realized in that the ultrasound radiation areas are respectively individually activated. The individual activation of the ultrasound radiation areas enables reciprocal effects, interferences and/or quenchings between or from ultrasound waves to occur that are irradiated from different and in particular oppositely disposed ultrasound radiation areas. This ensures a uniform, good and intensive treatment of the substrates with ultrasound over the entire substrate surfaces.

SUMMARY OF THE INVENTION

The ultrasound radiation areas of one container wall are preferably chronologically staggered, thereby reducing the aforementioned reciprocal effects. Pursuant to one preferred specific embodiment, each $n^{th}$ ultrasound radiation area, for example where n=3 then the first, fourth and seventh and/or the second, fifth and eighth, etc., is simultaneously activated, as a consequence of which a plurality, i.e. a group, of radiation areas is activated, so that in contrast to a respective individual chronologically staggered activation, the treatment speed can be increased without, however, having the aforementioned disadvantageous reciprocal effects occur.

Pursuant to a particularly advantageous specific embodiment of the invention, the ultrasound radiation areas of one container wall are activated in a chronological relationship to the ultrasound radiation areas of the other container wall, whereby advantageously ultrasound radiation areas of the container walls disposed across from one another are not activated simultaneously. As a consequence of this activation, in a particularly advantageous manner the irradiation of opposite container walls can be carried out without the disadvantageous reciprocal effects, interferences, attenuation or quenchings occurring between the ultrasound waves radiated from the oppositely disposed container walls.

During the treatment process the substrates are advantageously moved relative to the ultrasound radiation areas, in particular being raised and lowered, in order to enable a uniform treatment of the substrates over the surfaces thereof.

Pursuant to one particularly advantageous specific embodiment of the invention, the individual ultrasound radiation areas of one container wall are spatially offset relative to the ultrasound radiation areas of the other container wall in order to prevent regions where no ultrasound treatment occurs, since the radiation areas of the oppositely disposed container walls overlap one another.

The ultrasound radiation areas are advantageously strip-shaped, and are disposed either vertically or horizontally.

BRIEF DESCRIPTION OF THE DRAWINGS

The invention will be explained subsequently with the aid of advantageous specific embodiments with reference to the drawings, in which.

DESCRIPTION OF THE PREFERRED EMBODIMENTS

Figure 1:
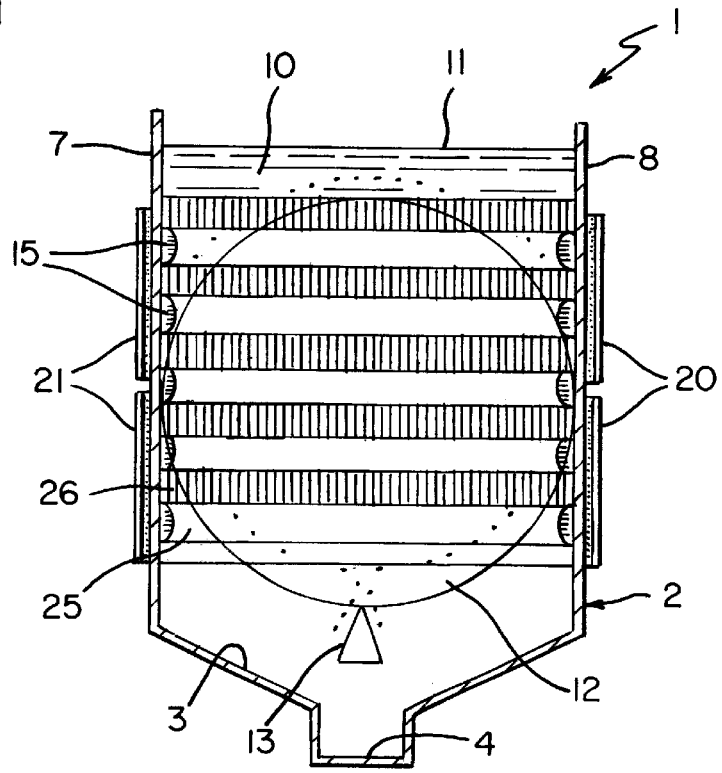
FIG. 1 a schematic illustration of one inventive apparatus having ultrasound radiation areas on oppositely disposed walls of a fluid container.

FIG. 1 shows, in cross-section, an apparatus 1 for treating substrates. The apparatus 1 comprises a fluid container 2 having a container base 3, which contains a recessed portion 4, and having container side walls 7 and 8. Disposed in the fluid container 2 are a treatment fluid 10 having an upper fluid surface 11, as well as substrates 12, for example wafers, which in the direction of viewing are oriented parallel to and one after another. An edge portion of the substrates 12 rests upon a substrate receiving device 13, which in the illustrated embodiment has the form of a so-called blade.

Since in the illustrated embodiment the substrate receiving device 13 cannot hold the substrate 12 by itself or cannot keep them oriented parallel to one another by itself, there are provided on the inner surfaces of the side walls 7, 8 of the fluid container 2 guides 15 for the wafers 12 that in the illustrated embodiment are embodied as slotted members that extend perpendicular to the surfaces of the wafers. The guides 15 are disposed on the two opposite container walls 7, 8, being respectively disposed at the same height.

In the illustrated embodiment, disposed on the container walls 7, 8 are ultrasound radiation devices 20 and 21 that over the container walls radiate ultrasound, preferably megasound for example in a frequency range of 900 to 1100 KHz, in the direction of the substrates 12. The arrangement of the ultrasound radiation devices 20 and 21 will be described subsequently in detail with the aid of FIGS. 2 and 3. As a consequence of the oppositely disposed guides 15, horizontal regions 25 and 26 occur, whereby in the regions 25 relative to the regions 26 only a lesser radiation of the substrates 12 is possible.

Due to the presence of the blade 13, it is possible to raise and lower the substrate 12 during the ultrasound treatment, so that the substrates move relative to the regions 25 and 26 in order to effect a uniform ultrasound irradiation of the substrates 12.

The arrangement and construction of the ultrasound radiation devices 20 and 21 will now be explained in greater detail with the aid of FIGS. 2 and 3. As can be seen, the ultrasound radiation devices are respectively formed by strip-like ultrasound radiation elements that are mounted from the outside on the respective container wall 8 or 7, preferably being adhesively applied thereto. Strip-like ultrasound radiation elements are known and will therefore not be described in further detail.

In the illustrated embodiment, twelve strip-like ultrasound radiation elements 20a–20l are mounted on the right container wall 8; these elements define a corresponding number of ultrasound radiation regions. The strip-like ultrasound radiation elements 20a–20f are mounted on an upper half of the container wall 8 parallel to one another, whereby respective small free spaces 30 result between the parallel elements. Directly below the arrangement of the ultrasound radiation elements 20a–20f are strip-like ultrasound radiation elements 20g–20l that are again disposed parallel to one another. A free space 31 is formed between the upper ultrasound radiation elements 20a–20f and the lower radiation elements 20g–20l.

In a similar manner, ultrasound radiation elements are mounted on the opposite container wall 7. However, only 10 ultrasound radiation elements 21a–21j are mounted, preferably adhesively, on) the container wall 7, whereby the ultrasound radiation elements 21a–21e form a first upper row, and the ultrasound radiation elements 21f–21j form a second row of ultrasound radiation elements directly below the first row. The ultrasound radiation elements 21a–21j mounted on the container wall 7 are arranged in such a way that they cover the intermediate spaces 30 between the ultrasound radiation elements 20a–20f and 20g–20l of the opposite container wall 8 and respectively partially overlap two adjacent ultrasound radiation elements of the opposite container wall 8. This spatial relationship between the respective ultrasound radiation elements on the side walls 7 and 8 can be seen particularly well in FIGS. 3A and B.

Figure 2:
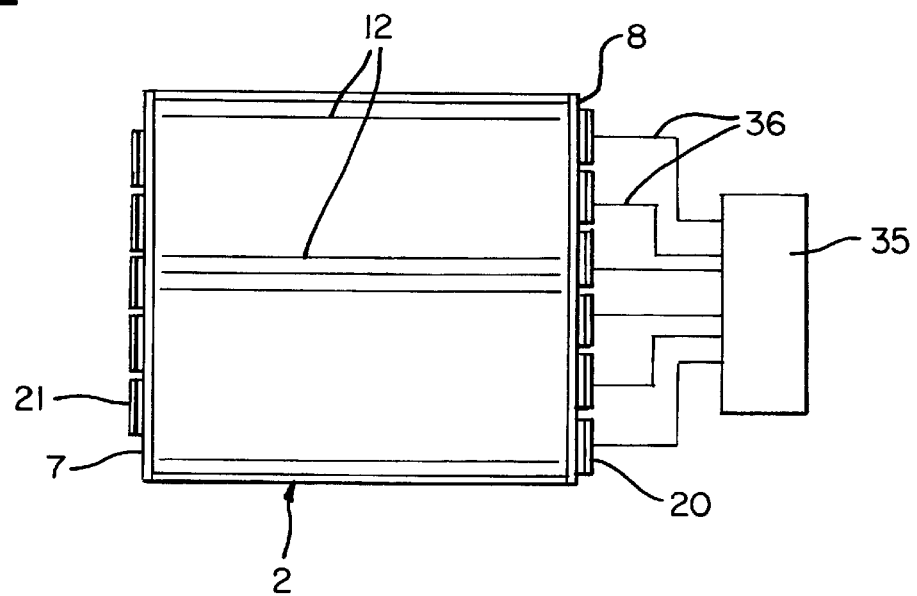
FIG. 2 a plan view of the inventive apparatus.
Figure 3A:
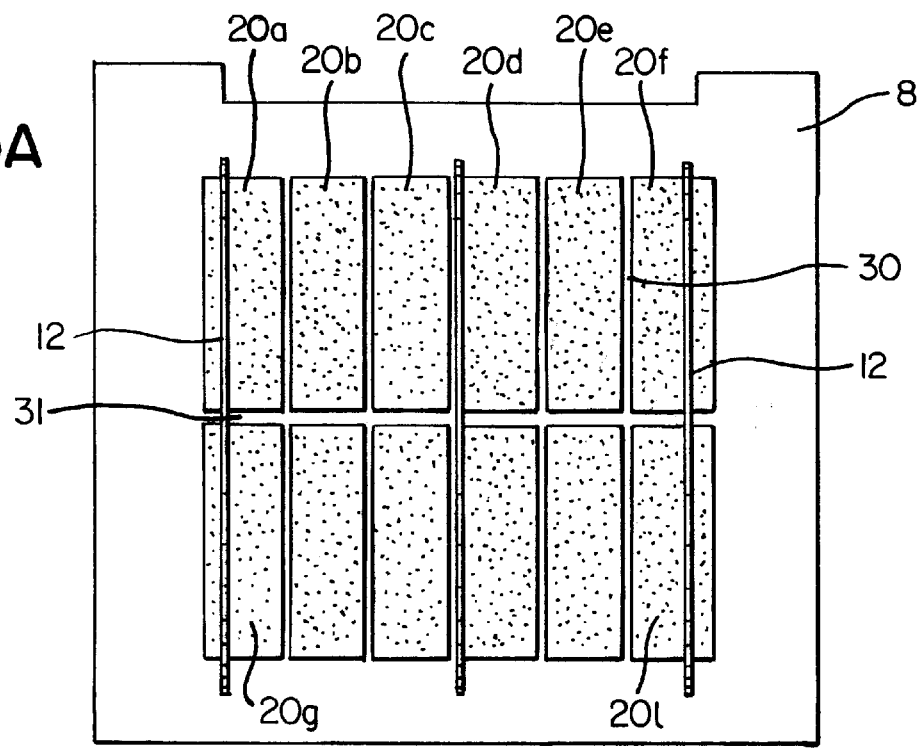
FIGS. 3A schematically the arrangement of one exemplary and 3B embodiment of ultrasound radiation areas on oppositely disposed walls of the fluid container.
Figure 3B:
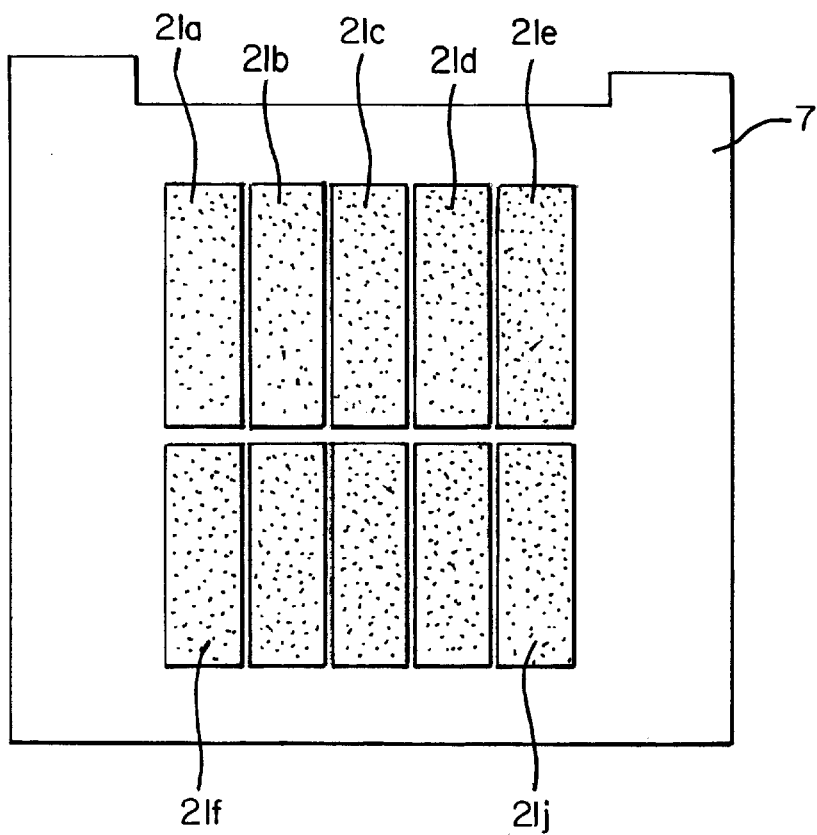

The ultrasound radiation elements 20a–20l can be respectively individually activated by an activation control device 35 that is schematically illustrated in FIG. 2 and that is respectively connected via lines 36 to the respective ultrasound radiation elements. In the same way, the ultrasound radiation elements 21a–21j on the container wall 7 can be respectively individually activated, whereby this is effected either via a non-illustrated second activation control device or via the activation control device 35 illustrated in FIG. 2

During the treatment of the substrates 12 that are disposed in the container 2 the ultrasound radiation elements on the oppositely disposed side walls 7 and 8 are respectively individually activated, and in particular in such a way that reciprocal effects, especially wave quenching or standing waves, are avoided. This occurs in particular due to the fact that the individual ultrasound radiation elements are activated or pulsed at different times. In this connection, due to an only slight danger of reciprocal effects, oppositely disposed ultrasound radiation elements, for example the elements 20a, 20g, can be activated at the same time, i.e. be handled as a single element. Furthermore, due to the spatial separation, each $n^{th}$ ultrasound radiation element, as well as the ultrasound radiation element disposed therebelow, can be simultaneously activated (whereby $n \geq 2$), so that respectively at least one ultrasound radiation element is disposed therebetween that is not activated and therefore no significant reciprocal effects are to be anticipated between the ultrasound waves irradiated from the individual radiation elements.

The greatest reciprocal effects or interaction between ultrasound waves irradiated from the ultrasound radiation elements occur if spatially overlapping ultrasound radiation elements on the oppositely disposed container walls are activated simultaneously. For this reason, the activation is effected in such a way that directly oppositely disposed or partially overlapping ultrasound radiation elements on the side walls 7 and 8 are not activated at the same time. Thus, for example, it would be conceivable to activate the ultrasound radiation elements 20a, 20f disposed on the container wall 8, as well as the ultrasound radiation element 21e disposed on the container wall 7, at the same time without significant reciprocal effects occurring between the generated ultrasound waves.

A simultaneous activation of a number of ultrasound radiation elements, as in the above example, is advantageous in order to increase the ultrasound energy that is to be irradiated into the treatment fluid, and hence the speed of treatment, since a number of elements are activated without reciprocal effects occurring between them.

The invention was previously described in conjunction with one preferred specific embodiment. However, modifications or other embodiments are possible for one skilled in the art without thereby departing from the inventive concept. For example, the strip-like ultrasound radiation elements, rather than being disposed vertically as illustrated, could be disposed horizontally. Furthermore, the number of ultrasound radiation elements could be varied depending on need.

The specification incorporates by reference the disclosure of German priority documents DE 197 58 267.2 of Dec. 31, 1997 and German Patent Application priority document PCT/EP98/07405 of Nov. 18, 1998.

The present invention is, of course, in no way restricted to the specification disclosure of the specification and drawings, but also encompasses any modifications within the scope of the appended claims.

What is claimed is:

1. A method of treating substrates in a fluid container with at least one fluid and ultrasound, said method including the steps of:

providing each of two oppositely disposed walls of the fluid container with at least two ultrasound radiation areas that can be respectively individually activated;

placing the substrates within the fluid container; and activating the ultrasound radiation areas of one of said container walls in a chronological relationship to the ultrasound radiation areas of the other of said container walls in such a way that directly oppositely disposed, at least partially overlapping ultrasound radiation areas of the container walls are not activated simultaneously, whereby said substrates disposed within the fluid container are treated with the at least one fluid and ultrasound.

2. A method according to claim 1, wherein the ultrasound radiation areas of a container wall are activated in a chronologically staggered manner.

3. A method according to claim 1, wherein n ultrasound radiation areas are provided and wherein each $n^{th}$ ultrasound radiation area of a container wall is activated simultaneously, whereby $n \leq 2$.

4. A method according to claim 1, wherein during a treatment process said substrates are moved relative to said ultrasound radiation areas.

5. A method according to claim 4, wherein during the treatment process said substrates are raised and lowered.

6. An apparatus for treating substrates with at least one fluid and with ultrasound, comprising:

a fluid container for accommodating substrates;

at least two ultrasound radiation areas disposed on each of two oppositely disposed walls of said fluid container, wherein said ultrasound radiation areas are adapted to be respectively individually activated; and means for activating directly oppositely disposed, at least partially overlapping ones of said ultrasound radiation areas of said container walls in a chronologically staggered manner to treat the substrates with the at least one fluid and ultrasound within the fluid container.

7. An apparatus according to claim 6, wherein said ultrasound radiation areas of a container wall are adapted to be activated in a chronologically staggered manner.

8. An apparatus according to claim 6, wherein a plurality of said ultrasound radiation areas of a container wall are adapted to be activated simultaneously.

9. An apparatus according to claim 6, wherein means are provided for providing relative movement of said substrates relative to said ultrasound radiation areas.

10. An apparatus according to claim 9, wherein said means for providing relative movement of said substrates is a blade device for raising and lowering said substrates.

11. An apparatus according to claim 6, wherein individual ones of said ultrasound radiation areas of one of said container walls are spatially offset relative to said ultrasound radiation areas of the other of said container walls.

12. An apparatus according to claim 6, wherein said ultrasound radiation areas are strip-shaped.

13. An apparatus according to claim 12, wherein said strip-shaped ultrasound radiation areas are disposed vertically.

14. An apparatus according to claim 12, wherein said strip-shaped ultrasound radiation areas are disposed horizontally.

* * * * *